(12) United States Patent
Hasumi et al.

(10) Patent No.: US 10,295,339 B2
(45) Date of Patent: May 21, 2019

(54) PATTERN MEASUREMENT METHOD AND MEASUREMENT APPARATUS

(71) Applicant: Hitachi High-Technologies Corporation, Minato-ku, Tokyo (JP)

(72) Inventors: Kazuhisa Hasumi, Tokyo (JP); Masami Ikota, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 24 days.

(21) Appl. No.: 15/215,756

(22) Filed: Jul. 21, 2016

(65) Prior Publication Data

US 2017/0030712 A1 Feb. 2, 2017

(30) Foreign Application Priority Data

Jul. 31, 2015 (JP) ................................ 2015-151450

(51) Int. Cl.
*G06K 9/00* (2006.01)
*G01B 15/06* (2006.01)
*G01B 15/04* (2006.01)
*H01J 37/26* (2006.01)
*H01L 21/66* (2006.01)

(52) U.S. Cl.
CPC ............ *G01B 15/06* (2013.01); *G01B 15/04* (2013.01); *H01J 37/26* (2013.01); *G01B 2210/56* (2013.01); *H01L 22/12* (2013.01); *H01L 22/20* (2013.01)

(58) Field of Classification Search
CPC .... G01B 15/06; G01B 15/04; G01B 2210/56; H01J 37/26; H01L 22/20; H01L 22/12
See application file for complete search history.

(56) References Cited

U.S. PATENT DOCUMENTS 5,815,685 A * 9/1998 Kamon ............... G03F 7/70441
430/296
6,124,212 A * 9/2000 Fan ................... H01L 21/31138
257/E21.256

(Continued)

FOREIGN PATENT DOCUMENTS

JP 7-27548 A 1/1995
JP 2013-137202 A 7/2013

*Primary Examiner* — Aaron W Carter
(74) *Attorney, Agent, or Firm* — Crowell & Moring LLP

(57) ABSTRACT

A pattern measurement method and measurement apparatus are provided that appropriately evaluate the deformation of a pattern occurring due to a micro loading effect. In order to achieve the above-mentioned object, there are provided pattern measurement method and apparatus that measure a dimension of a pattern formed on a sample. In the pattern measurement method and apparatus, distances between a reference pattern and a plurality of adjacent patterns adjacent to the reference pattern or inner diameters of the reference pattern in a plurality of directions are measured, and the measurement results of the plurality of distances between the reference pattern and the adjacent patterns or the measurement results of the inner diameters of the reference pattern in the plurality of directions are classified according to distances between the reference pattern and the adjacent patterns or directions of the patterns adjacent to the reference pattern.

8 Claims, 12 Drawing Sheets

(56) References Cited

U.S. PATENT DOCUMENTS

| | | | | |
|---|---|---|---|---|
| 6,423,242 B1* | 7/2002 | Kojima | | C03C 17/3435 |
| | | | | 216/71 |
| 6,661,912 B1* | 12/2003 | Taguchi | | G01N 21/95607 |
| | | | | 356/237.2 |
| 7,906,761 B2* | 3/2011 | Tanimoto | | G01N 23/225 |
| | | | | 250/306 |
| 8,367,306 B1* | 2/2013 | Doty | | G02B 6/138 |
| | | | | 355/84 |
| 2002/0051916 A1* | 5/2002 | Ki | | G03F 1/36 |
| | | | | 430/30 |
| 2003/0027064 A1* | 2/2003 | Ki | | G03F 1/78 |
| | | | | 430/30 |
| 2007/0114453 A1* | 5/2007 | Emi | | B82Y 10/00 |
| | | | | 250/492.2 |
| 2007/0228003 A1* | 10/2007 | Huang | | G03F 7/70616 |
| | | | | 216/41 |
| 2008/0073574 A1* | 3/2008 | Kamikubo | | B82Y 10/00 |
| | | | | 250/492.2 |
| 2008/0159609 A1* | 7/2008 | Miyamoto | | G06T 7/0006 |
| | | | | 382/128 |
| 2009/0242760 A1* | 10/2009 | Miyamoto | | G01B 15/00 |
| | | | | 250/307 |
| 2010/0282956 A1* | 11/2010 | Kimba | | H01J 37/28 |
| | | | | 250/252.1 |
| 2013/0285256 A1* | 10/2013 | Fischer | | H01L 21/486 |
| | | | | 257/774 |
| 2014/0145192 A1* | 5/2014 | Momono | | H01L 27/14605 |
| | | | | 257/48 |
| 2015/0041649 A1* | 2/2015 | Wang | | H01J 37/222 |
| | | | | 250/310 |
| 2015/0235912 A1* | 8/2015 | Momono | | H01L 27/14603 |
| | | | | 257/48 |
| 2016/0320182 A1* | 11/2016 | Yamaguchi | | G01B 15/00 |
| 2017/0030712 A1* | 2/2017 | Hasumi | | G01B 15/06 |

* cited by examiner

FIG. 5
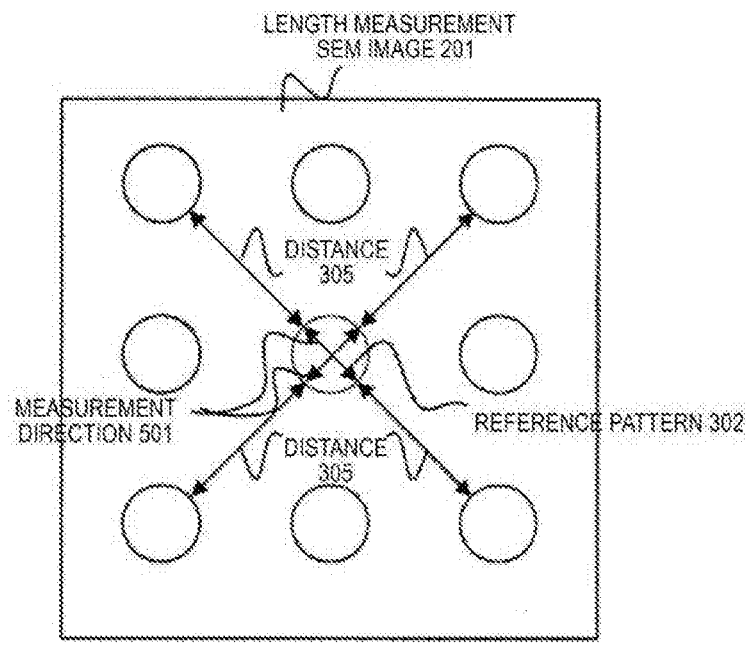
FIG. 6
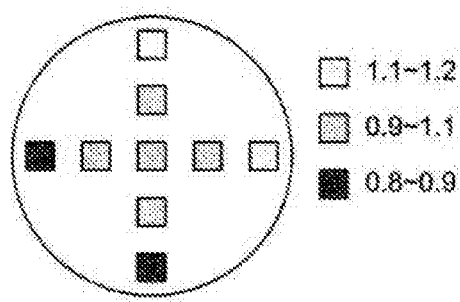
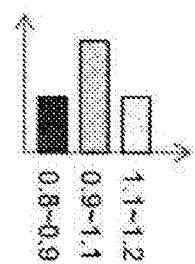
EXAMPLE OF MAP DISPLAY        EXAMPLE OF GRAPH DISPLAY

PATTERN MEASUREMENT METHOD AND MEASUREMENT APPARATUS

TECHNICAL FIELD

The present invention relates to pattern measurement method and measurement apparatus, and more particularly, to a method and an apparatus that evaluate a deformation cause of a pattern in a semi conductor manufacturing process.

BACKGROUND ART

In the dimension measurement of a semiconductor pattern, a pattern edge on an image is detected based on a high-resolution image captured by a scanning electron microscope, and a dimension is measured from an edge coordinate thereof. A shape of a measuring target pattern is a line pattern or a hole pattern. If the shape thereof is the line pattern, a line width or a pitch is a main measuring target, and if the shape thereof is the hole pattern, a diameter is a main measuring target.

PTL 1 describes a shape evaluation method of evaluating a shape of the hole pattern based on an image acquired by a scanning electron microscope. PTL 1 discloses a method of performing a polar coordinate development with a center of the hole pattern as a reference and measuring the pattern on a polar coordinate development image. PTL 2 describes a method of evaluating the shape of the pattern by measuring a dimension between correspondence points of a reference pattern and a measuring target pattern.

CITATION LIST

Patent Literature

PTL 1: JP-A-H7-27548
PTL 2: JP-A-2013-137202

SUMMARY OF INVENTION

Technical Problem

Recently, the three-dimensional structurization of semiconductor device such as a semiconductor memory progresses, and as such a semiconductor device, there is a pillar-shaped pattern extending in a direction perpendicular to a sample surface. The pillar-shaped pattern is seen to be the same circular pattern as the hole pattern when viewed on an electron microscope image. Meanwhile, it is apparent that in such a pillar structure, a pattern is deformed due to the micro loading effect during dry-etching. As long as the degree of occurrence of such a micro loading effect can be evaluated, it is possible to select appropriate pattern design or structure condition or to perform process control. However, PTL 1 and 2 do not intend to evaluate the micro loading effect.

Hereinafter, pattern measurement method and measurement apparatus for appropriately evaluating pattern deformation occurring due to a micro loading effect will be suggested.

Solution to Problem

As an aspect for achieving the aforementioned object, there are provided pattern measurement method and apparatus for measuring a dimension of a pattern formed on a sample based on a detection signal acquired based on irradiation of a charged particle beam. In the method and apparatus, distances between a reference pattern and a plurality of adjacent patterns adjacent to the reference pattern or inner diameters of the reference pattern in a plurality of directions are measured; and the measurement results of the plurality of distances between the reference pattern and the adjacent patterns or the measurement results of the inner diameters of the reference pattern in the plurality of directions are classified according to distances between the reference pattern and the adjacent patterns or directions of the patterns adjacent to the reference pattern.

Advantageous Effects of Invention

According to the above-described configuration, it is possible to appropriately evaluate pattern deformation occurring due to a micro loading effect.

BRIEF DESCRIPTION OF DRAWINGS

FIG. 5 is a diagram showing an example in which distances between a reference pattern and surrounding patterns adjacent to the reference pattern in a diagonal direction are measured.
FIG. 6 is a diagram showing examples of display of values of measurement results, MAP display and graph display.

DESCRIPTION OF EMBODIMENTS

Figure 1:
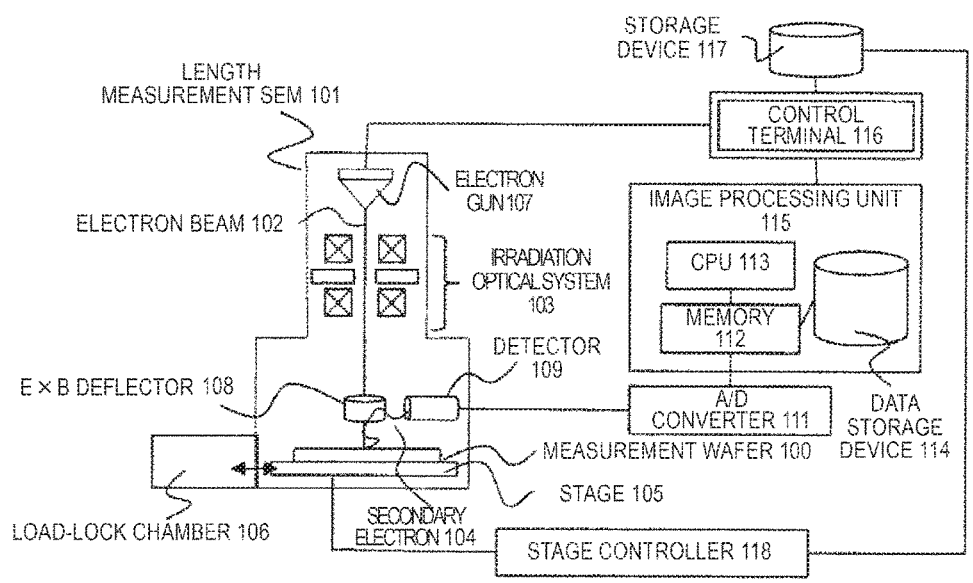
FIG. 1 is a diagram showing an example of semiconductor pattern evaluation apparatus.

In the case of a semiconductor memory, as a portion that accumulates data, a capacitor is used in DRAM, an insulator is used in FLASH memory, and a ferroelectric substance is used in FeRAM (FRAM (registered trademark)). These components have characteristic sectional structures, respectively.

Meanwhile, as a portion that accumulates data of a next-generation semiconductor memory, a magnetic substance is used in MRAM (STTRAM), a multilayer film including a metal film is used in ReRAM, and a chalcogenide is used in PRAM. Sectional structures of the data accumulation portions of the particularly promising MRAM and ReRAM have circular pillar shapes. During dry-etching for forming such a pillar structure, a micro loading effect is added, and the pillar structure is distorted in some cases. The degree of such distortion is changed depending on a pitch of a mask pattern or a size of a space. The distortion based on the micro loading effect is also caused in a line and space type, or a VIA type as well as the pillar type.

The pattern distortion due to the micro loading effect is mainly caused during the baking of a pattern on a resist mask in a lithography process or the forming of a pattern in an etching process such as dry-etching. For example, an etching rate is different between a portion where a pattern density is coarse and a portion where the pattern density is dense, and a shape of the pattern is changed depending on an environment in which the pattern is positioned. In the case of a circular pillar structure, since the etching rate is high in a case where adjacent patterns are closely positioned (a case where the pattern density is dense) and the etching rate is low in a case where the adjacent patterns are remotely positioned (a case where the pattern density is coarse), if distances from the adjacent patterns are different due to the directions, a contour shape of the pattern is distorted in some cases due to difference of the etching rate according to the directions of the patterns. The distortion of the circular pattern is also found in the lithography and the pattern is distorted due to a proximity effect in some cases.

In the embodiments to be described below, a method and an apparatus that appropriately evaluate a micro loading effect will be described.

For example, the following embodiments relate to a measurement method including an image capturing step of capturing a measured image of a circular pattern, a selection step of selecting a circular pattern to be measured from the measured image captured in the image capturing step, a calculation step of calculating a minimum direction (angle) and a maximum direction (angle) of an adjacent circular pattern from the circular pattern selected in the selection step, a measurement step of measuring dimensions in the calculated angel directions in the calculation step, and a ratio quantifying step of quantifying a ratio by using the value measured in the measurement step, and a measurement apparatus that performs the measurement in the aforementioned step. According to such a measurement method, it is possible to quantify distortion of a circle in the circular pattern as an index value.

Embodiment 1

A configuration example of a semiconductor pattern evaluating apparatus according to the present embodiment will be described with reference to FIG. 1. A length measurement scanning electron microscope (SEM) 101 of the semiconductor pattern evaluating apparatus according to the present embodiment includes an irradiation optical system 103 that controls an electron beam 102, and a detection system that detects a secondary electron 104 emitted from a sample. The microscope includes a stage 105 that transports a measurement wafer 100 which is the sample and a load-lock chamber 106. The electron beam 102 passes through an electron gun 107 that emits the electron beam and the irradiation optical system 103 (including a condenser lens, an objective movable aperture, an alignment coil, a stigma coil, a deflecting coil, and an objective lens) present on a passage of the electron beam 102. Thus, the electron beam is concentrated after the irradiation position shift and astigmatism thereof are compensated and the irradiation position thereof is controlled. Thereafter, the measurement wafer 100 on the stage 102 is irradiated with the electron beam.

The irradiated measurement wafer 100 emits the secondary electron 104, and induces the secondary electron 104 toward a detector 109 constituting the detection system by an E×B deflector 108 constituting the detection system. The curved secondary electron 104 is detected by the detector 109. The detected secondary electron 104 is converted into a digital signal by an A/D converter 111, and is stored as an image in a memory 113.

An image processing unit 115 acquires measurement method data from a measurement method library (recipe) stored in a data storage device 114 by using an image stored in a memory 112 and the information input by a control terminal 116, and measures a pattern dimension.

The control terminal 116 (calculation device) is a control terminal of the entire apparatus that includes an input device such as a mouse or a keyboard or a display device such as a monitor. The control terminal can adjust the irradiation condition of the electron beam 102 by controlling the entire length measurement SEM 101 or can manage the irradiation position on the wafer by controlling a stage controller 118, and can control a processing method of the image processing unit 115 and output the processed image. The processing in the image processing unit 115 is controlled according to an image processing program previously recorded in a storage medium 117. An operation program (recipe) causing the length measurement SEM to automatically execute measurement to be described below is stored in a storage medium, and the control terminal 116 controls the length measurement SEM by using the operation program.

Figure 2:
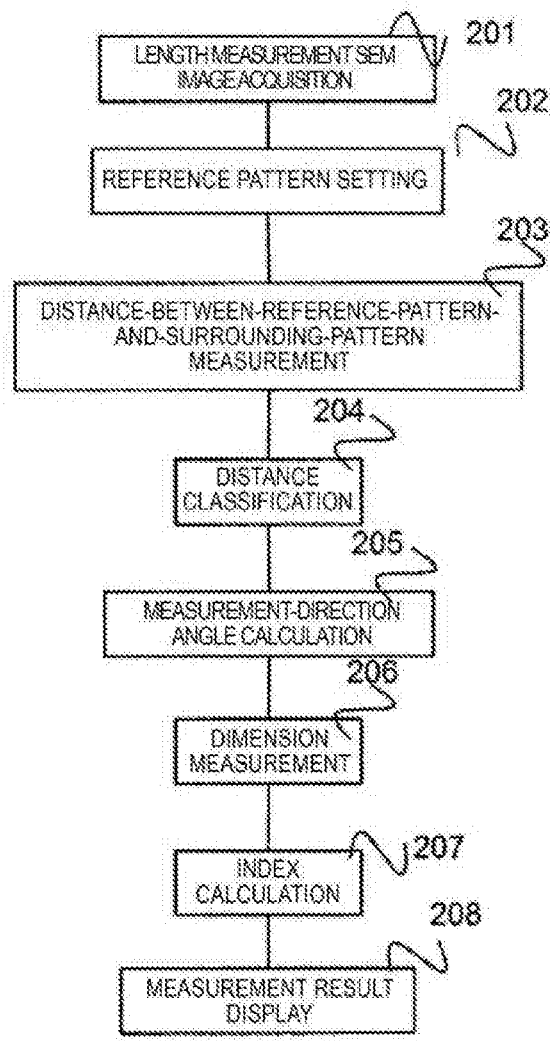
FIG. 2 is a flowchart showing a process of representing a micro loading effect as an index value.

FIG. 2 is a flowchart showing a circular pattern distortion measurement process. A length measurement SEM image is acquired such that all of a pattern as a reference captured by the length measurement SEM 101 and patterns adjacent thereto are present in an image range. Reference pattern setting 202 for selecting a pattern of which all surrounding patterns adjacent thereto are present in an image as the reference pattern is initially performed. Subsequently, distance-between-reference-pattern-and-surrounding-pattern measurement 203 for measuring distances between the reference pattern and all the surrounding patterns adjacent thereto is performed.

Subsequently, distance classification 204 for grouping the measured distances according to the distances is performed, and measurement-direction angle calculation 205 for calculating an angle by connecting diagonals of the group having the same distance is performed. Thereafter, dimension measurement 206 is performed in directions calculated in the measurement-direction angle calculation 205, and the distances grouped in the distance classification 204 are averaged. If there are two groups, index calculation 207 for calculating a ratio between the two groups is performed, and displaying 208 of the measurement results such as display of values, representation of MAP, or representation of graph is performed.

Figure 3:
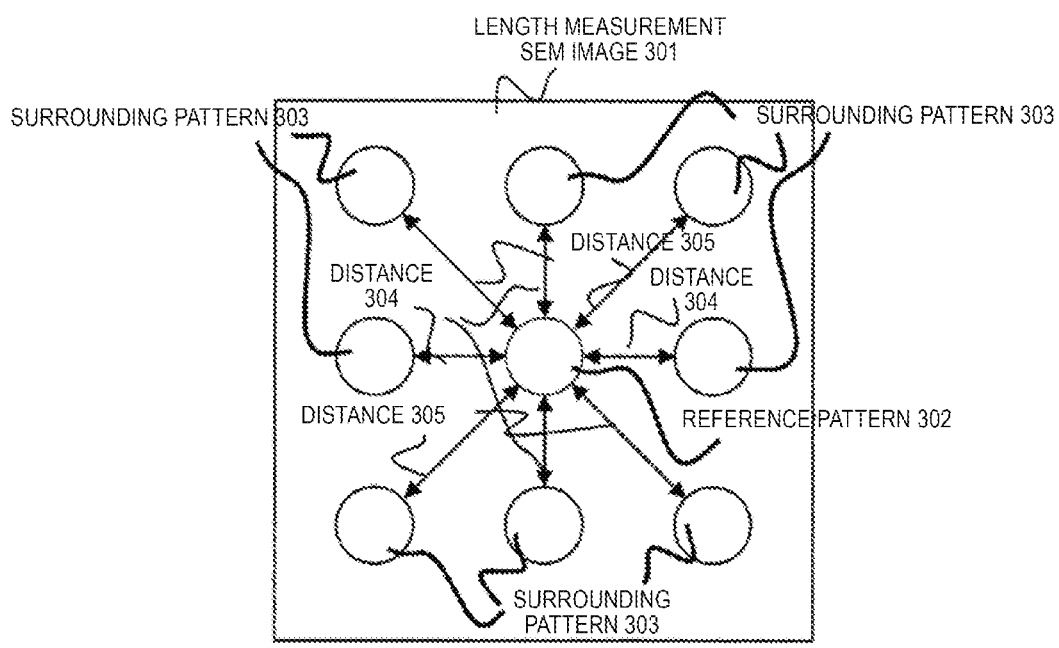
FIG. 3 is a diagram showing an example in which distances between a reference pattern and surrounding patterns adjacent to the reference pattern are measured.
Figure 4:
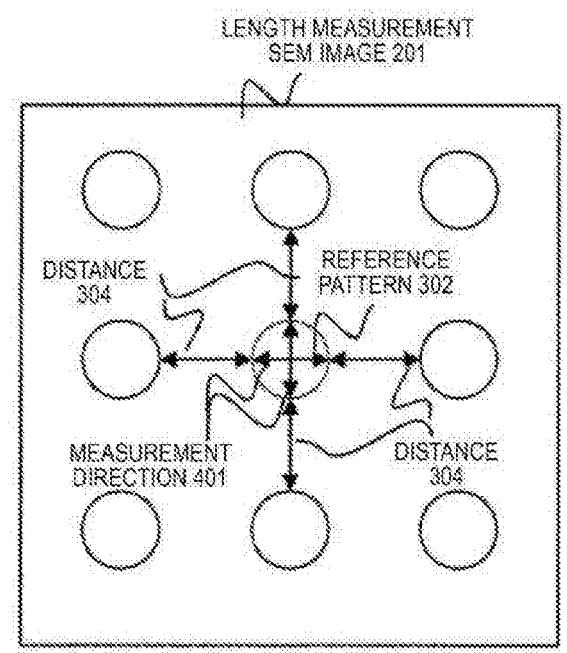
FIG. 4 is a diagram showing an example in which distances between a reference pattern and surrounding patterns adjacent to the reference pattern in up, down, left and right directions are measured.

In FIGS. 3, 4 and 5, the measurement method is described based on the measurement flow shown in FIG. 2. In length measurement SEM image acquisition 201, a length measurement SEM image 301 is acquired such that a circular pattern as a reference and all surrounding circular patterns adjacent thereto are included. Subsequently, in reference pattern setting 202, a reference pattern 302 of which all surrounding patterns 303 are present is determined.

In FIG. 3, a center is used as the reference pattern 302. Subsequently, in distance-between-reference-pattern-and-surrounding-pattern measurement 203, distances between the reference pattern 302 and the surrounding patterns 303 are measured. In distance classification 204, distances 304 and distances 305 are respectively grouped (classified) as Group 1 and Group 2.

Thereafter, in measurement-direction angle calculation 205, a measurement direction is determined for each group. A measurement direction of Group 1 is shown in FIG. 4, and a measurement direction of Group 2 is shown in FIG. 5. A measurement direction 401 is set for the pattern is in FIG. 4, and a measurement direction 501 is set for the pattern in FIG. 5.

Subsequently, in dimension measurement 206, the dimension measurement is performed on each group depending on the measurement direction, and in index calculation 207, indices such as average of Group 1, average of Group 2, and average of Group 1/average of Group 2 are calculated. For example, roundness may be acquired based on a disjunction between the division result of Group 1 and Group 2 and an ideal value of the division result of Group 1 and Group 2 acquired from previously stored design data (a ratio or a difference between both the result and the ideal value), and the roundness may be used as an index value. In this case, it can be said that in a case where a matching degree to the ideal value is high (the difference between both the result and the ideal value is 0 or the ratio is 1), the roundness is the highest.

In measurement result display 208, display (output example of CSV file or txt file) of values, an example in which chips colored as intervals are displayed as MAP and a graph example of a histogram divided into intervals shown in FIG. 6 are performed.

Embodiment 2

Figure 7:
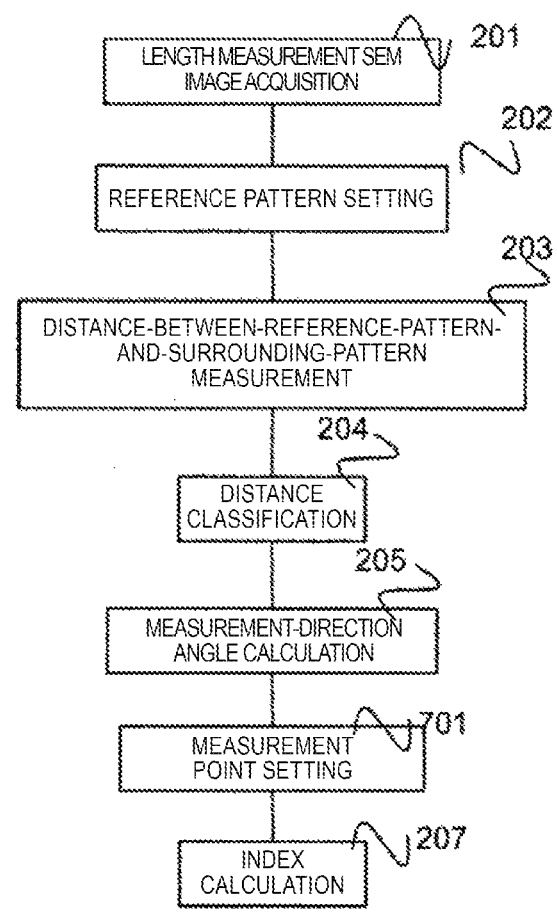
FIG. 7 is a flowchart showing a process of calculating an index value based on the measurement of the distances between the reference pattern and the surrounding patterns.

In the present embodiment, an example of an apparatus that performs measurement multiple times will be described. In a configuration example of a semiconductor pattern evaluating apparatus according to the present embodiment, the description of components having the same functions will be omitted. In the present embodiment, an example of the apparatus that performs the measurement multiple times is described by using a part of the flow of the distortion measurement method of the circular pattern shown in FIG. 2 as a recipe. FIG. 7 shows a part of the flow of the circular pattern distortion measurement method shown in FIG. 2 which can be used as a recipe. In the present apparatus, the measurement method data is acquired from the measurement method library (recipe) stored in the data storage device 114 by using the information input by the control terminal 116, and thus, the pattern dimension can be measured. At the time of recipe generation, a recipe of the part which can be used as the recipe is generated using a wafer.

Figure 8:
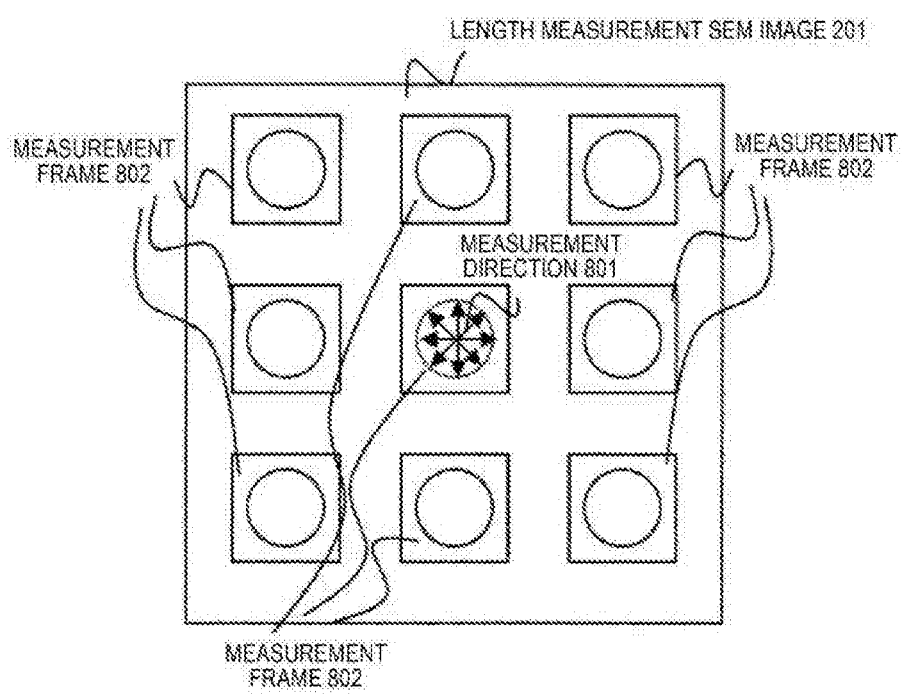
FIG. 8 is a diagram showing an example of a setting method in a measurement direction.

Here, since the length measurement SEM image acquisition 201 to the measurement-direction angle calculation 205 and the index calculation 207 have the same functions, and the description thereof will be omitted. In measurement point setting 701, as shown in FIG. 8, a measurement direction 801 is determined by the measurement-direction angle calculation, and each pattern is used as a measurement point by setting a measurement frame 802 for each pattern. Such setting is performed such that the pattern is measured by using a part of the flow as a library or a recipe.

Embodiment 3

Figure 9:
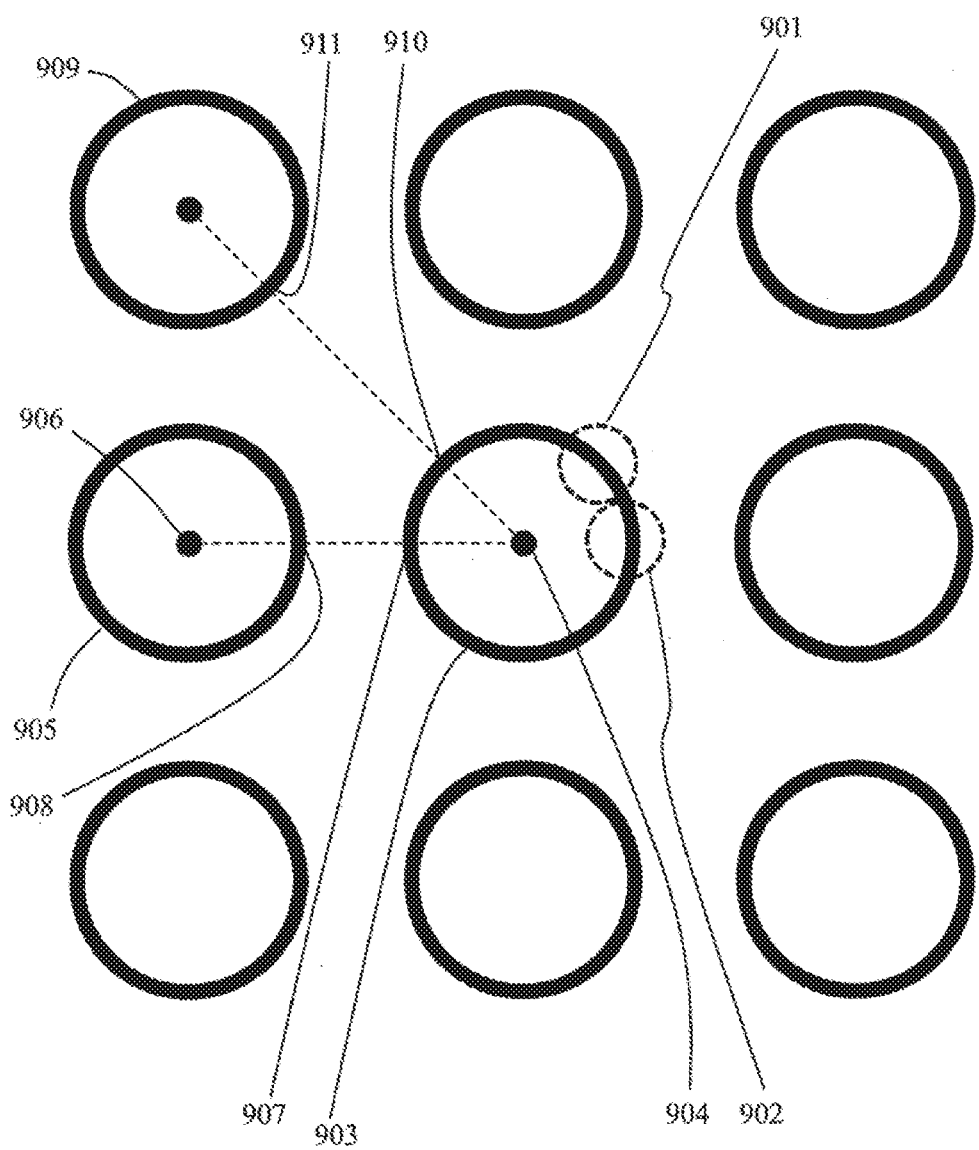
FIG. 9 is a diagram showing a SEM image acquired by capturing 9 pillar structures from the top.

Hereinafter, another example in which a micro loading effect is represented as an index value based on the acquisition of the electron microscope image will be described. FIG. 9 is a diagram showing an example of a SEM image of a sample in which pillar structures are arranged. In this drawing, an example of a SEM image acquired by capturing 9 pillar structures from the top is shown. A change of the pattern due to the micro loading effect is highly likely to occur in a pattern edge portion (for example, a portion 901) facing a portion where the patterns are coarse, and the change thereof is less likely to occur in a pattern edge portion (for example, a portion 902) facing a portion where the patterns are dense. Accordingly, as long as the degree of deformation of the portion facing the portion where the patterns are dense and the degree of deformation of the portion facing the portion where the patterns are coarse can be quantified, the pattern deformation caused due to the micro loading effect can be represented as an index value.

Figure 10:
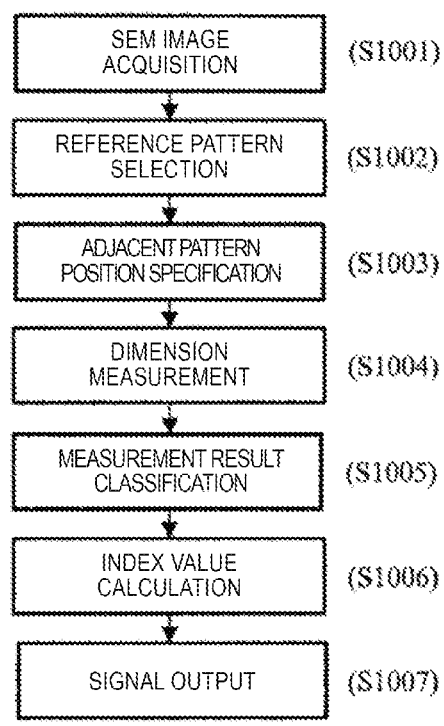
FIG. 10 is a flowchart showing a process of representing a micro loading effect as an index value based on the measurement of dimensions between the reference pattern and the surrounding patterns.

In the present embodiment, a method of quantifying the micro loading effect based on the measurement of a dimension between adjacent patterns will be described. FIG. 10 is a flowchart showing a measurement process stored in a capturing recipe. Similarly to Embodiment 1, the SEM image is initially acquired by positioning a measuring target pattern in the visual field of the electron microscope based on coordinate information stored in the capturing recipe (step 1001). Subsequently, one pattern (pillar-shaped structure) 903 as a measuring reference is selected on the SEM image (step 1002). For example, the SEM image shown in FIG. 9 may be displayed on the display device, and an operator may select the pattern using a pointing device. The pattern may be previously selected on the design data, and the pattern may be automatically found by the control of the apparatus using the capturing recipe generated based on the design data and the selected data. When the pattern is selected, in a case where a unique pattern is present near the plurality of arranged pillar structures, the measuring target pattern may be automatically specified by previously registering the pattern image as a template and performing template matching.

Subsequently, a position of a pattern adjacent to the reference pattern is specified (step 1003). Since the ideal positional relationship between the adjacent pattern and the reference pattern is determined by referring to the design data, the position of the adjacent pattern may be specified by referring to the previously registered design data. The position of the adjacent pattern may be specified by the pattern recognition on the SEM image. Since the position of the adjacent pattern is specified in order to determine a measurement direction to be described below, it is preferable that the pattern position is specified based on the pattern recognition on the SEM image in order to determine an appropriate measurement direction depending on a forming state of an actual pattern.

Thereafter, a dimension between the adjacent pattern of which the position is specified and the reference pattern 903 is measured (step 1004). For example, at the time of the measurement, a center (or center of gravity) positron 904 of the reference pattern and a center (or center of gravity) position 906 of the adjacent pattern 905 are specified, and a dimension between an edge 907 of the reference pattern 903 and an edge 908 of the adjacent pattern 905 is measured in a straight line that connects both the center positions. In the present embodiment, inter-edge dimensions between the reference pattern and 8 adjacent patterns adjacent to the reference pattern 903 are measured. The dimension measurement is performed by setting a length measurement cursor such that a straight line which connects the center positions is included and specifying a peak position of a luminance change signal (profile waveform) thereof.

Subsequently, the measurement results are classified (step 1005). In the present embodiment, since 8 measurement results are acquired, the measurement results are classified depending on the positions (directions) of the adjacent patterns or the measurement results. In the example of FIG. 9, the measurement results may be classified into two types. One type is a pattern (for example, the pattern 905) positioned in the up, down, left or right direction of the reference pattern 903, and the other type is a pattern (for example, the pattern 909) positioned in the diagonal direction of the reference pattern. For example, the classification is performed depending on the positional information indicating whether the adjacent pattern is positioned in the up, down, left and right direction or is positioned in the diagonal direction of the reference pattern 903, or the size of the measurement result. For example, in a case where the classification is performed on the positional information, it is considered that the classification is performed using the positional information specified through the image recognition. In a case where the classification is performed depending on the size of the measurement result, if the sizes thereof are greatly classified in the example of FIG. 9, since the classification into two sizes (measurement results) can be performed, the measurement results are classified into two types through threshold determination. For example, influence such as noise is removed from the classified measurement result by performing arithmetic mean (statistical processing).

Thereafter, the index value for quantifying the micro loading effect is calculated based on the classified measurement result (step 1006). As mentioned above, the micro loading effect acts such that an edge facing a region where the patterns are coarse is greatly deformed. Thus, if the amount of a distance (first distance) between the edge 907 and the edge 908 reduced from a reference value of a distance (second distance) between an edge 910 and an edge 911 is large, a pattern density is coarse, and thus, it is possible to estimate that the pattern deformation (of the pattern reduction) due to the micro loading effect is generated. Accordingly, a difference or a ratio between a reference value acquired from the design data and an actual measurement value is acquired, and an alert indicating that the influence of the micro loading effect is great is generated in a case where a difference value related to the second distance is greater than a difference value related to the first distance (in a case where the reduction amount is large) or in a case where a disjunction therebetween is equal to or greater than a predetermined value (step 1007). Thus, the operator can know a possibility that the pattern deformation due to the micro loading effect is generated. It is possible to quantitatively evaluate the micro loading effect by simply outputting the index value.

Embodiment 4

Figure 11:
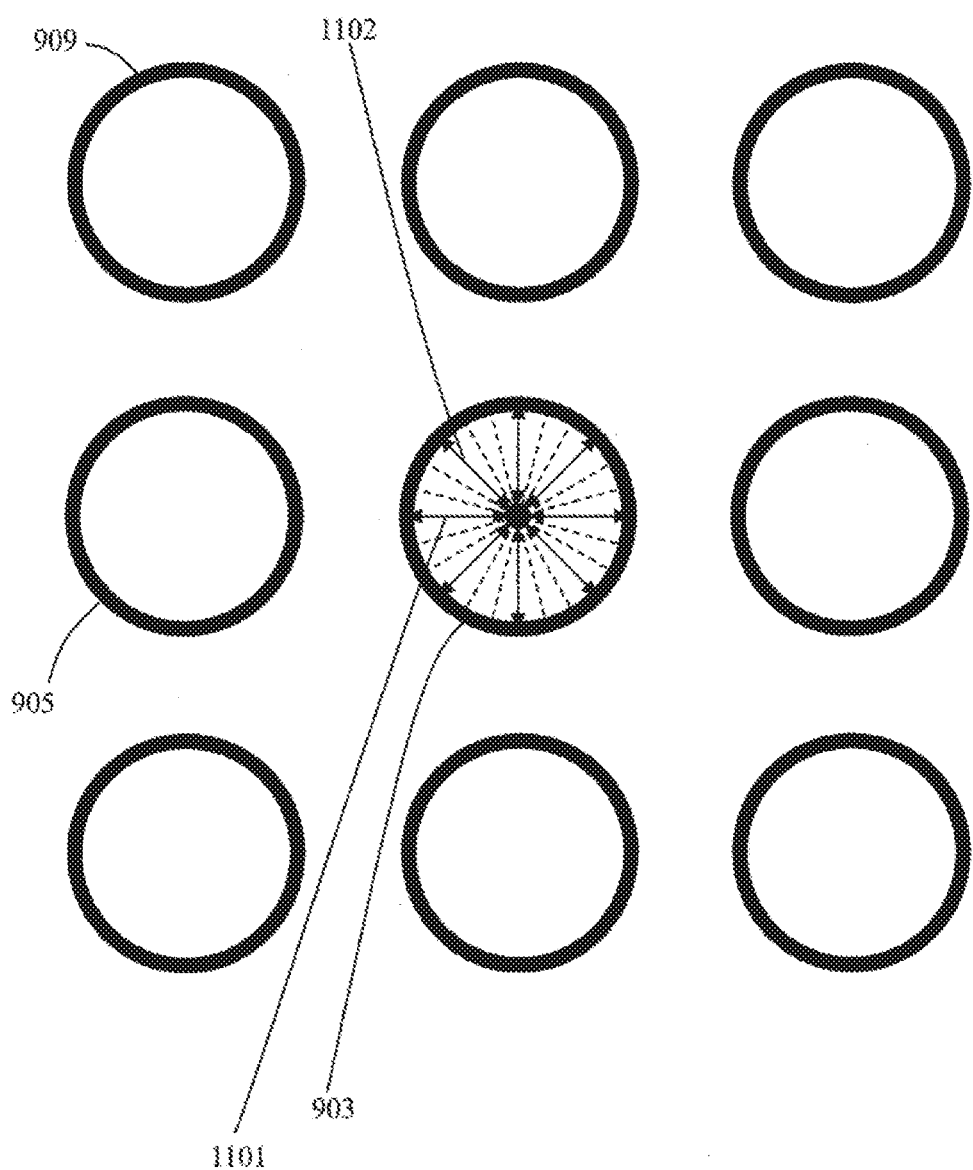
FIG. 11 is a diagram showing an example in which an inner diameter of the reference pattern is measured.
Figure 12:
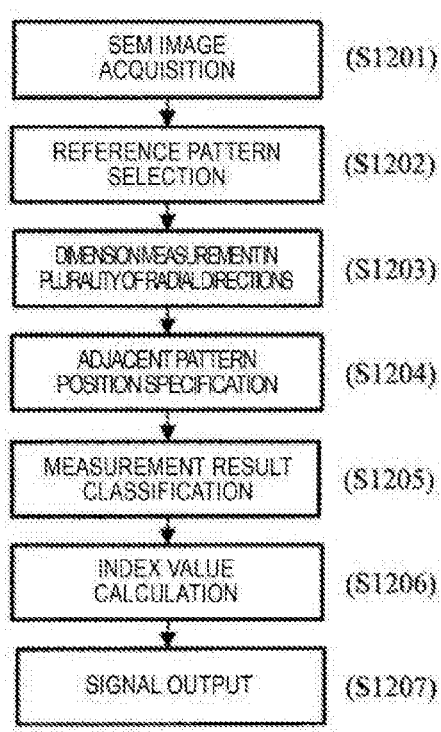
FIG. 12 is a flowchart showing a process of representing a micro loading effect as an index value based on the inner diameter measurement of the reference pattern.

It has been described in Embodiment 3 that the index value of the micro loading effect is calculated based on the measurement of the dimension between the reference pattern and the adjacent pattern. However, an example in which the index value of the micro loading effect is calculated based on the evaluation of a radius or a diameter of the reference pattern will be described in the present embodiment. FIG. 11 is a diagram for describing an example in which a plurality of measurement points (for example, measurement in a 360° direction on a per 1° basis) is set in a radial direction within the reference pattern 903, and the measurement directions for evaluating the micro loading effect from the measurement results are classified and evaluated. FIG. 12 is a flowchart showing a measurement process. Until the SEM image is acquired and the reference pattern is selected, the same flowchart as that shown in FIG. 10 is performed. However, in the flowchart shown in FIG. 12, after the dimension measurement in a plurality of radial directions is initially performed (step 1203), the measurement result for quantifying the micro loading effect is selected. More specifically, in the example of FIG. 11 in which after the dimension measurement in the plurality of directions is performed, the position of the adjacent pattern is specified (step 1204) and a measurement result in an adjacent pattern direction is extracted (classified) from the dimension measurement results in the plurality of directions (step 1205), a measurement position 1101 is extracted as a measurement position corresponding to the adjacent pattern 905. A measurement position 1102 is selected as a measurement position corresponding to the adjacent pattern 909.

As stated above, the extracted measurement results are further classified into two types of groups depending on the measurement direction or the measurement result, and the index value is calculated (step 1206). In a case where an inner diameter (diameter or radius) of the reference pattern is a measuring target, a dimension ratio or a dimension difference between a direction in which the patterns are coarse and a direction in which the patterns are dense is calculated, and thus, the calculated dimension ratio or dimension difference can be used as the index value of the micro loading effect. For example, if the dimension difference between the direction in which the patterns are coarse and the direction in which the patterns are dense is 0 or approximates 0, it is possible to determine that there is no partial pattern deformation due to the micro loading effect. In contrast, in a case where the difference therebetween is large, it is possible to determine that the partial pattern deformation due to the micro loading effect is great.

The operator can quantitatively evaluate the micro loading effect by checking such index value output (step 1207).

Embodiment 5

Figure 13:
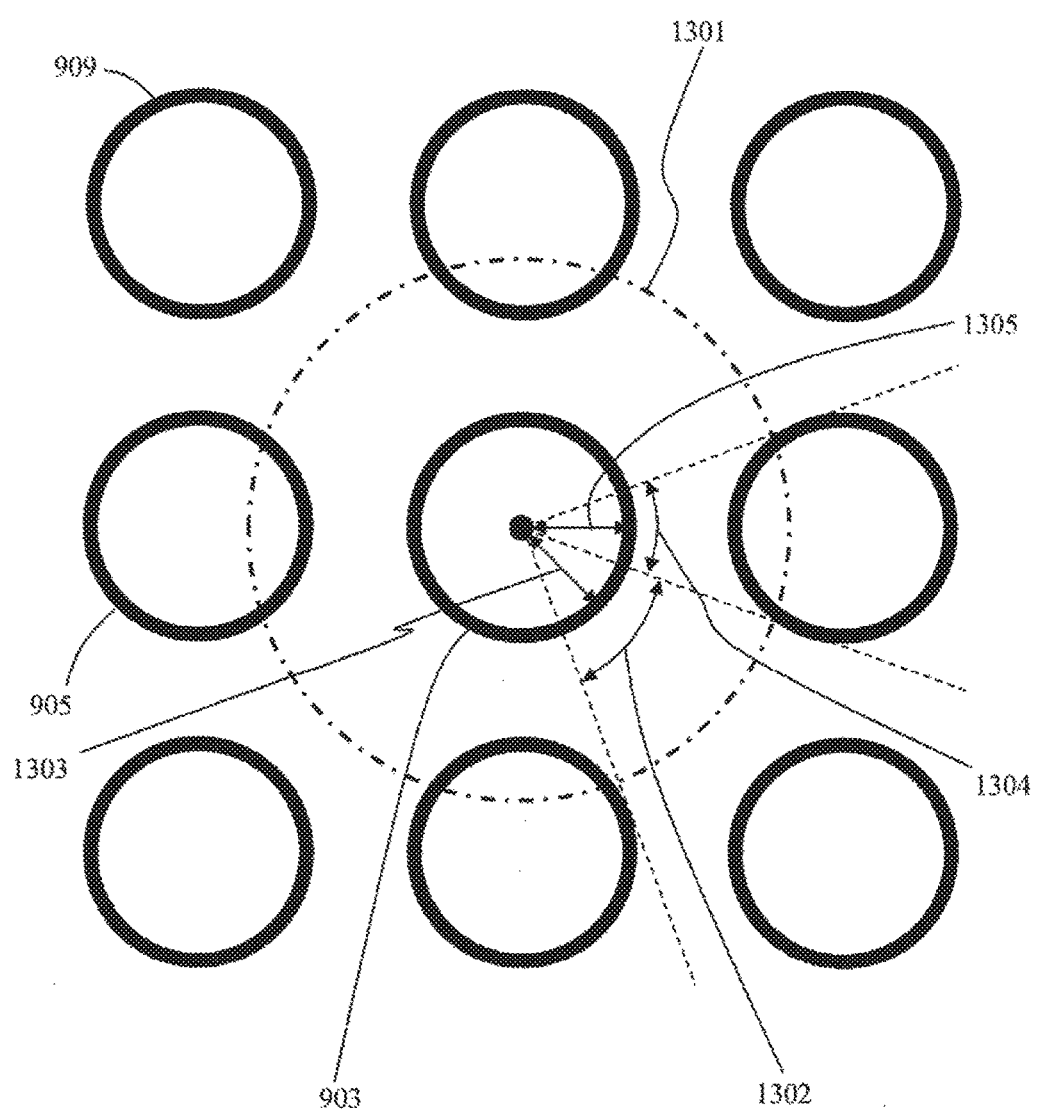
FIG. 13 is a diagram showing an example in which an angle range in which adjacent patterns are present and an angle range in which the adjacent patterns are not present are discriminated.

It has been described in the above-described embodiments that the directions of all the adjacent patterns adjacent to the reference pattern 903 are specified and the index value is calculated. However, in the present embodiment shown in FIG. 13, an example in which in a case where there is no adjacent pattern in a predetermined distance range 1301 from the reference pattern 903, a measurement result 1303 in a direction range 1302 is acquired on the assumption that there is no pattern in this direction (the micro loading effect is not changed) will be described. In a case where there are adjacent patterns in the predetermined distance range 1301, a measurement result 1305 of a direction region 1304 may be acquired, and an index value may be calculated based on the difference or ratio between this measurement result and the measurement result 1303.

Embodiment 6

Figure 14:
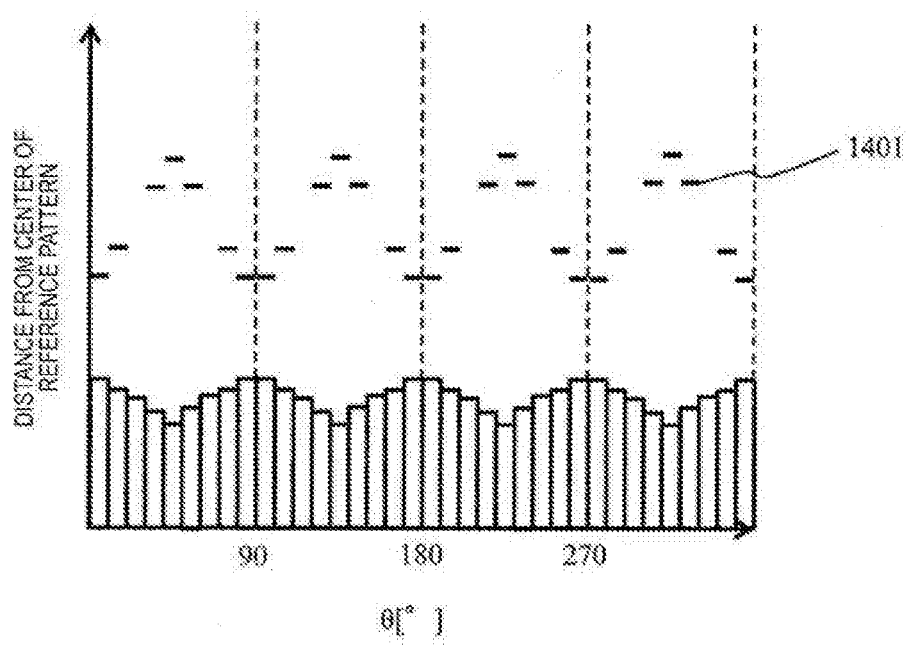
FIG. 14 is a polar coordinate development diagram of the measurement result of the inner diameter of the reference pattern.

FIG. 14 is a diagram showing an example in which the results acquired by measuring the distance between the center and the edge of the reference pattern 903 in the 360° direction are developed as polar coordinates. Such a graph is displayed on the display device connected to the electron microscope. For example, in the example of FIG. 14, the arithmetic mean is performed on the dimension measurement performed on a per 1° basis on a per 10° basis, and the results are represented as a graph. In the example of FIG. 14, an example in which radius values at 0°, 90°, 180° and 360° are large, whereas radius values in angle ranges using 45°, 135°, 225° and 315° as a center are small is shown. This example shows that the adjacent patterns are arranged adjacent to the reference pattern 903 in the up, down, left and right directions (0°, 90°, 180° and 360° directions), whereas the pattern is not present near the reference pattern in the diagonal directions (45°, 135°, 225° and 315° directions), and the edges of the reference pattern 903 in the diagonal directions are retreated (deformed) due to the micro loading effect. In the graph shown in FIG. 14, edge positional information 1401 of the adjacent pattern is displayed so as to be superimposed. As mentioned above, the positional information of the adjacent patterns as well as the shape information of the reference pattern is displayed, and thus, the relationship between the positions of the adjacent patterns and the micro loading effect can be visually displayed. Information indicating whether or not there is a pattern in a specific angle range instead of the positional information of the adjacent pattern is displayed, and thus, the relationship between the presence of the adjacent pattern and the micro loading effect cab be ascertained.

For example, even though the polar coordinate development is not displayed, an arithmetic mean value of radius values in an angle range in which the patterns are positioned adjacent to the reference pattern and an arithmetic mean value of radius values of two reference patterns in an angle range in which there is no pattern or the patterns are positioned so as to be separated from the reference pattern are displayed, and thus, the micro loading effect can be visually checked.

Since the circular pillar structures are arranged periodically and serially, if the pattern is deformed due to the micro loading effect, the radius of the pattern is periodically changed on the polar coordinate development image. For example, since such a chance depends on the arrangement condition of the patterns, frequency analysis may be performed on measurement result waveforms based on the acquisition of the radius value, and an alert indicating that the pattern is deformed due to the micro loading effect may be generated when a measurement result waveform as a specific frequency waveform of which a wave height is equal to or greater than a predetermined vale is detected. The signal waveforms may be previously stored, and the presence or absence of a specific signal waveform may be detected through fitting.

REFERENCE SIGNS LIST

101: length measurement SEM
102: electron beam
103: irradiation optical system
104: secondary electron
105: stage
106: load-lock chamber
107: electron gun
108 E×B deflector
109: detector
111: A/D converter
112: memory
113: CPU
114: data storage device
115: image processing unit
116: control terminal
117: storage device
118: stage controller

The invention claimed is:

1. A pattern measurement method of measuring a dimension of a pattern formed on a sample based on a detection signal acquired based on irradiation of a charged particle beam, the method comprising:
    obtaining an image representative of a plurality of patterns;
    setting a reference pattern and a plurality of adjacent patterns adjacent to the reference pattern on the obtained image;
    measuring distances between the reference pattern and the plurality of adjacent patterns;
    classifying the measurement results of the plurality of distances between the reference pattern and the plurality of adjacent patterns according to distances between the reference pattern and the plurality of adjacent patterns;
    performing statistical processing on each of the classified measurement results; and
    outputting a visual display of an index value indicating a degree of deformation of the plurality of adjacent patterns due to a micro loading effect obtained based on the statistical processing.

2. The pattern measurement method according to claim 1, wherein the classifying of the measurement results is divided into a classification in which the distance between the reference pattern and a first adjacent pattern is a first distance and a classification in which the distance between the reference pattern and a second adjacent pattern is a second distance.

3. The pattern measurement method according to claim 2, wherein a difference or a ratio between the first distance and the second distance is calculated.

4. A pattern measurement apparatus comprising:
    a memory to store an image processing program for measuring a dimension of a pattern formed on a sample based on a detection signal acquired based on irradiation of a charged particle beam; and
    a control terminal to:
    obtain an image representative of a plurality of patterns,
    set a reference pattern and a plurality of adjacent patterns adjacent to the reference pattern on the obtained image,
    measure the dimension of the pattern formed on the sample based on the detection signal acquired based on irradiation of the charged particle beam,
    measure distances between the reference pattern formed on the sample and the plurality of adjacent patterns,
    classify the measurement results of the plurality of distances between the reference pattern and the plurality of adjacent patterns according to distances between the reference pattern and the plurality of adjacent patterns, perform statistical processing on each of the classified measurement results; and output a visual display of an index value indicating a degree of deformation of the plurality of adjacent patterns due to a micro loading effect obtained based on the statistical processing.

5. The pattern measurement apparatus according to claim 4, wherein the control terminal divides the classification of the measurement results into a classification in which the distance between the reference pattern and a first adjacent pattern is a first distance and a classification in which the distance between the reference pattern and a second adjacent pattern is a second distance.

6. The pattern measurement apparatus according to claim 4, wherein the control terminal calculates a difference or a ratio between a first measurement result and a second measurement result.

7. The pattern measurement apparatus according to claim 6, wherein the control terminal calculates an index value of a micro loading effect based on the calculation of the difference or ratio.

8. The pattern measurement apparatus according to claim 6, wherein the control terminal generates an alert indicating that the pattern is deformed due to influence of the micro loading effect when a calculation value of the difference or ratio satisfies a predetermined condition.

* * * * *